United States Patent

Seki et al.

Patent Number: 5,277,929
Date of Patent: Jan. 11, 1994

[54] METHOD FOR MASKING THROUGH HOLES IN MANUFACTURING PROCESS OF PRINTED CIRCUIT BOARD

[75] Inventors: Kameharu Seki; Yasuaki Otani; Isamu Kubo, all of Saitama, Japan

[73] Assignee: Nippon CMK Corp., Japan

[21] Appl. No.: 775,826

[22] Filed: Oct. 11, 1991

[30] Foreign Application Priority Data

Oct. 15, 1990 [JP] Japan ................... 2-275974

[51] Int. Cl.$^5$ ................................ C23C 26/00
[52] U.S. Cl. .............................. 427/97; 427/96
[58] Field of Search ........................ 427/97, 96

[56] References Cited

U.S. PATENT DOCUMENTS

| | | | |
|---|---|---|---|
| 3,464,855 | 9/1969 | Shaheen | 427/96 |
| 3,725,215 | 4/1973 | Uchytil | 427/96 |
| 4,088,545 | 5/1978 | Supnet | 427/97 |
| 4,312,897 | 1/1982 | Reimann | 427/97 |
| 4,615,781 | 10/1986 | Boudreau | 427/96 |
| 4,728,568 | 3/1988 | Sasada | 427/97 |

Primary Examiner—Shrive Beck
Assistant Examiner—Vi Duong Dang
Attorney, Agent, or Firm—Bruce L. Adams; Van C. Wilks

[57] ABSTRACT

A method for masking through-holes during the manufacture of a printed circuit board comprises providing a substrate having a plurality of through-holes. A removable masking seal comprised of a soluble material, a light-setting material or a thermo-setting material is formed on the surface of the substrate to cover at least one of the through-holes. At least one of the through-holes that is not covered with the masking seal is filled with a filler material by a conventional silk screen process. The masking seal is then removed, either by dissolving the masking seal in the case of the soluble material, or in the case of the light-setting or thermo-setting material, the masking seal is set by applying light or heat to reduce adhesion between the masking seal and the substrate, and then the set masking seal is peeled off to expose the through-hole.

13 Claims, 1 Drawing Sheet

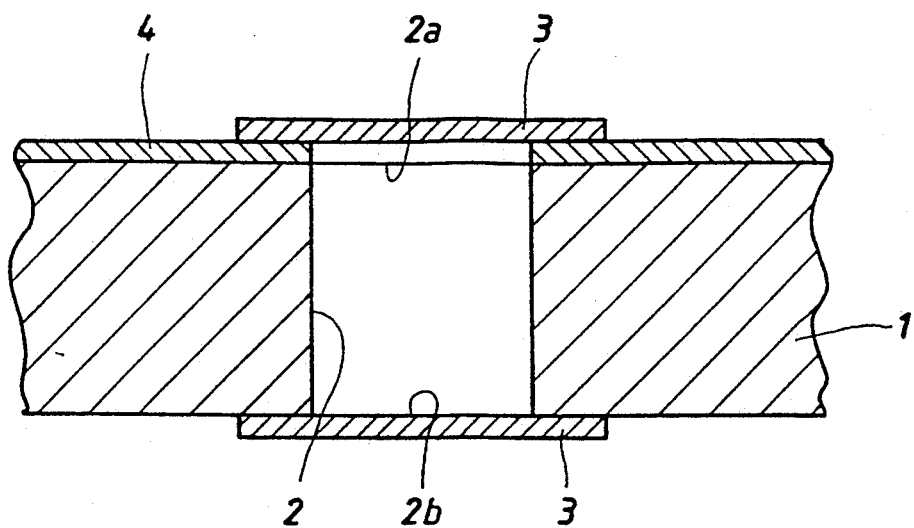

METHOD FOR MASKING THROUGH HOLES IN MANUFACTURING PROCESS OF PRINTED CIRCUIT BOARD

BACKGROUND OF THE INVENTION

The present invention relates to a method for masking through holes in the process of manufacturing printed circuit board.

A printed circuit board, the filling of through holes provided in the printed circuit board with a filler is usually carried out across the entire surface of the substrate by silk screen printing.

Thus, when filling the through holes with the filler over the entire surface of the substrate, it is necessary to first mask the openings of the through holes which are not required to be filled with filler (such as holes for mounting electric components thereon) before preceding to the filling work.

The masking of the openings of such through holes can be performed by manually sticking an adhesive tape made of synthetic resin onto the opening of the through holes requiring masking.

Furthermore, after the completion of the filling step across the entire surface of the substrate followed by the setting of the filler filled in the through holes, the adhesive tape must be manually removed.

Masking the through holes that are not going to be filled is conducted before the filling step during the conventional manufacturing process of the printed circuit board. The masking is manually performed in the transfer step of the substrate, so that it is necessary to perform a complicated procedure such as adhering the adhesive tape. Also cutting work is done by means of a cutter, which results in the surface of the substrate sustaining damage in the cutting work with a cutter, which leads to a defectiveness.

Also, the adhesive tape must be manually peeled off after the filler is set. The peeling work using a cutter is complicated and The adhesive tape that may not be perfectly removed. adhesive agent of the adhesive tape remains on the substrate causes a defective to occur during etching.

In addition, serious drawbacks resulting from peeling off the adhesive tape by a cutter and the like, the set filler may be damaged, the working atmosphere may be deteriorated, deterioration of working atmosphere, or the cutter may damage the surface of the substrate and cause a defective end product.

To overcome the disadvantages of the masking method of the through holes in the conventional process of manufacturing a printed circuit board, the present invention provides a method for masking through holes enabling an easy and quick masking without deteriorating the working atmosphere, as well as an easy and quick release from the masking state.

SUMMARY OF THE INVENTION

The masking method in accordance with the present invention comprising the step of filling through holes int he process of manufacturing the printed circuit board, wherein among said through holes a water soluble, seal or light or thermosetting seal is disposed on the opening of the through holes that are not to be filled (such as an electric components mounting hole).

As a result, according to the present invention, seals having a diameter corresponding to the hole diameter is provided to thereby make it possible to automatically easy and quickly perform masking.

BRIEF DESCRIPTION OF THE DRAWINGS

The object and advantages of the present invention will become more apparent, when viewed in conjunction with the following drawing, in which;

FIG. 1 is an enlarged sectional view showing an embodiment of the present invention.

DESCRIPTION OF THE PREFERRED EMBODIMENTS

An embodiment of the masking method in accordance with the present invention will be hereinafter described with reference to the accompanying drawing.

The drawing is a partially enlarged sectional view showing the state of masking a through hole in the masking method in accordance with the present invention.

First of all, among through holes provided in a printed circuit board 1, the through holes 2 which are not required to be filled with a filler, for example, holes for mounting electric components, may be positionally detected in advance following a pattern formed on the substrate 1 of each printed circuit board. Alternatively the through holes 2 disposed at predetermined positions in the pattern may be selected for the purpose of masking.

The masking of the through holes 2 of the substrate 1 which are to be masked is carried out by disposing a masking seal 3 onto openings 2a and 2b.

Furthermore, the seals 3 for masking the openings 2a and 2b of the through hole may be formed from a water-soluble seal having an adhesive bond, or the light or thermo-setting seal, and preferably configured to have at least an outer diameter larger than that of the through hole 2.

Such masking seal 3 are stuck onto the openings 2a and 2b of the through hole 2 to mask the through hole 2.

Also, the masking work for the associated through-holes 2 is effected during the transfer processes of the substrate 1. After the adhesion of the seals 3 onto the openings the seals 3 are stuck to the openings 2b after the substrate 1 has been once turned over.

Furthermore, the adhesion of the seals 3 onto the aforesaid through holes 2 is executed previous to the filling of the filler which will be executed over the entire surface of the substrate 1 with respect to the other through holes. The removal of the seals 3 disposed on the through holes 2 is carried out after the setting of the filler in the through holes that are filled in the filling process.

As to the removal of a the seals 3, in the case of water-soluble seal, a dissolving liquid is injected on the seals 3 portion thereby dissolving the seals to remove them. On the contrary, when the seal 3 is a light or thermo-setting seal 3, for example, in the case of an ultra-violet light setting seal 3, an ultra-violet light is irradiated to set the seal 3, while in the case of thermo-setting seal 3, heat radiation is applied, thereby setting the seal 3 reducing the adhesiveness and allowing it to be cleared from the openings 2a and 2b by means of a simple peeling process.

Further, the adhesive bond of the seal 3 is simultaneously dissolved or set at the time of the aforesaid dissolving and setting, so the adhesive is not allowed to remain on the openings 2a and 2b of the through hole 2.

In the drawing, reference numeral 4 denotes a conductive layer.

As can be seen from the above description, the masking work of the through holes in the process for fabricating the printed circuit board can be effected easily and quickly, and without damaging the substrate, while the removal work of the masking after the completion of the filling process of the through holes can also be executed easily and quickly and without damaging the substrate, to consequently accelerate the automatization of this type of work.

The description above has been offered for illustrative purposes only, which is not intended to limit the scope of the invention of this application which is defined in the claims below, but may be other wise and optionally embodied or practiced without departing from the spirit or essential character thereof.

What is claimed is:

1. A method for masking through holes in the manufacturing process of a printed circuit board, comprising the steps of: providing a substrate having a plurality of through holes; disposing one of photo-setting and thermo-setting seals for masking over openings of at least one of the through holes that is provided for mounting electric components to the substrate to prevent a filler material from entering the masked through holes; filling the through holes that are not masked with a filler material and then applying either light to the photosetting material or heat to the thermo-setting material to set the seal and reduce adhesion between the masking seal and the substrate.

2. A method for masking through holes according to claim 1; wherein said seals disposed over the openings of said through holes are removed after said filling step.

3. A Method for masking through holes according to claim 1; wherein the seals disposed over the openings of the through holes are removed by being peeled off from the openings of the through holes after setting and after the completion of the filling step.

4. A method of masking through-holes during the manufacture of a printed circuit board, comprising the steps of: providing a substrate having an obverse surface and a reverse surface and having a plurality of through-holes extending through the subtrate from the obverse surface to the reverse surface; forming a removable masking seal composed of at least one of a photo-setting material and a thermo-setting material on at least one of the obverse and reverse surfaces so as to cover and mask at least one of the through-holes to prevent a filler material from entering the masked through-holes; filling a filler material into at least one through-hole that is not covered with the masking seal and then applying either light to the photosetting material or heat to the thermo-setting material to set the seal and reduce adhesion between the masking seal and the substrate.

5. A method of masking through-holes according to claim 4; wherein the masking seal comprises a photo-setting material; and further comprising applying light to set the photo-setting masking seal to reduce adhesion between the masking seal and the substrate so as to facilitate removal of the set masking seal; and peeling off the set masking seal to remove the set masking seal from the substrate and to expose the at least one through-hole.

6. A method of masking through-holes according to claim 4; wherein the masking seal comprises a thermo-setting material; and further comprising applying heat to set the thermo-setting masking seal to reduce adhesion between the masking seal and the substrate so as to facilitate removal of the set masking seal; and peeling off the set masking seal to remove the set masking seal from the substrate and to expose the at least one through-hole.

7. A method of masking through-holes according to claim 4; including forming a removable masking seal on both the obverse surface and the reverse surface of the substrate to completely seal the openings of the at least one through-hole.

8. A method of masking through-holes according to claim 4; wherein the masking seal has a diameter slightly larger than the diameter of the at least one through-hole.

9. A method of masking through-holes according to claim 4; wherein said at least one through-hole is provided for mounting electric components.

10. A method of masking through-holes during the manufacture of a printed circuit board, comprising the steps of: providing a substrate having an obverse surface and a reverse surface and having a plurality of through-holes extending through the substrate from the obverse surface to the reverse surface; forming a removable masking seal composed of a thermo-setting material on at least one of the obverse and reverse surfaces so as to cover and mask at least one of the through-holes to prevent a filler material from entering the masked through-holes; filling a filler material into at least one through-hole that is not covered with the masking seal; applying heat to set the thermo-setting masking seal and reduce adhesion between the masking seal and the substrate so as to facilitate removal of the set masking seal; and peeling off the set masking seal to remove the set masking seal from the substrate and to expose the at least one through-hole.

11. A method of masking through-holes according to claim 10; further comprising forming a removable masking seal on both the obverse surface and the reverse surface of the substrate to completely seal the openings of the at least one through-hole.

12. A method of masking through-holes according to claim 10; wherein the thermo-setting masking seal is formed on the substrate having a diameter corresponding to the diameter of the at least one through-hole.

13. A method of masking through-holes according to claim 10; wherein the at least one through-hole is provided for mounting electric components.

* * * * *